United States Patent
Masuda

(10) Patent No.: US 8,159,300 B2
(45) Date of Patent: Apr. 17, 2012

(54) SIGNAL CONVERSION CIRCUIT AND RAIL-TO-RAIL CIRCUIT

(75) Inventor: Makoto Masuda, Chiba (JP)

(73) Assignee: Thine Electronics, Inc., Tokyo (JP)

( * ) Notice: Subject to any disclaimer, the term of this patent is extended or adjusted under 35 U.S.C. 154(b) by 115 days.

(21) Appl. No.: 12/666,966

(22) PCT Filed: Jun. 25, 2008

(86) PCT No.: PCT/JP2008/061576
§ 371 (c)(1),
(2), (4) Date: Apr. 7, 2010

(87) PCT Pub. No.: WO2009/001872
PCT Pub. Date: Dec. 31, 2008

(65) Prior Publication Data
US 2010/0188152 A1 Jul. 29, 2010

(30) Foreign Application Priority Data
Jun. 27, 2007 (JP) ................................. 2007-169592

(51) Int. Cl.
*H03F 3/45* (2006.01)
(52) U.S. Cl. ........................................................ 330/253
(58) Field of Classification Search .................. 330/253; 327/563
See application file for complete search history.

(56) References Cited

U.S. PATENT DOCUMENTS

| 4,797,631 A | 1/1989 | Hsu et al. |
| 5,608,352 A | 3/1997 | Itakura |
| 6,121,836 A | 9/2000 | Vallencourt |
| 7,202,738 B1 * | 4/2007 | Huijsing et al. ............... 330/253 |
| 7,692,454 B2 * | 4/2010 | Miura et al. ..................... 327/65 |
| 7,812,645 B2 * | 10/2010 | Miura et al. ..................... 327/65 |
| 2004/0080367 A1 | 4/2004 | Crain et al. |

FOREIGN PATENT DOCUMENTS

| JP | 61-186009 A | 8/1986 |
| JP | 1-188111 A | 7/1989 |
| JP | 7-183741 A | 7/1995 |
| JP | 11-355065 A | 12/1999 |
| WO | 2006/126436 A1 | 11/2006 |

* cited by examiner

*Primary Examiner* — Steven J Mottola
(74) *Attorney, Agent, or Firm* — Sughrue Mion, PLLC

(57) ABSTRACT

A signal conversion circuit 2 according to an embodiment of the present invention has a difference amplifier 10 and a source follower 20. The difference amplifier 10 has first and second resistors 11, 12 connected in series, third and fourth resistors 13, 14 connected in series, first and second PMOS transistors 15, 16, and a current source 18. The source follower 20 has first and second NMOS transistors 22, 24. A source of the first NMOS transistor 22 is connected between the first and second resistors 11, 12, while a source of the second NMOS transistor 24 is connected between the third and fourth resistors 13, 14.

5 Claims, 8 Drawing Sheets

SIGNAL CONVERSION CIRCUIT AND RAIL-TO-RAIL CIRCUIT

CROSS REFERENCE TO RELATED APPLICATIONS

This application is a National Stage of International Application No. PCT/JP2008/061576 filed Jun. 25, 2008, claiming priority based on Japanese Patent Application No. 2007-169592, filed Jun. 27, 2007, the contents of all of which are incorporated herein by reference in their entirety.

TECHNICAL FIELD

The present invention relates to a signal conversion circuit, and particularly to a signal conversion circuit for converting a common-mode voltage of a differential voltage signal, as well as to a rail-to-rail circuit that has this signal conversion circuit.

BACKGROUND ART

A receiving apparatus for receiving a differential voltage signal requires a wide range of input common-mode voltages in order to cope with common-mode voltage offset or a low-voltage interface that is dependant on the conditions of a transmission apparatus and a transmission line. Such receiving apparatus is provided with a rail-to-rail circuit that has a signal conversion circuit for converting a common-mode voltage of an input differential signal into a predetermined voltage level and one or more differential amplifier circuits connected to a rear stage of the signal conversion circuit. For example, in an LVDS (Low-Voltage Differential Signaling) receiving apparatus that transmits/receives a digital signal by changing the direction of a current in a pair of differential transmission lines terminated by resistors, a signal conversion circuit converts an input common-mode voltage into a voltage that is higher than a value obtained by adding a predetermined offset voltage to a threshold value (Vthn) of an NMOS transistor, in order to operate a high-speed NMOS difference amplifier on a rear stage. Furthermore, it is required for the electronic devices that are operated with a low power-supply voltage to perform a so-called rail-to-rail operation to ensure a dynamic range in the circuit.

An input rail-to-rail signal conversion circuit described in Patent Document 1 has a differential amplifier circuit in which a pair of n-type transistors receives an input differential signal, and a source follower circuit in which a pair of p-type transistors receives an input differential signal and supplies a current to a pair of load resistors of the differential amplifier circuit. In this signal conversion circuit, the differential amplifier circuit is operated in a region where an input voltage level is higher than a first threshold voltage, and the source follower circuit is operated in a region where the input voltage level is lower than a second threshold voltage, whereby input rail-to-rail is realized complementarily. In a cooperative region where the input voltage level is at least the first threshold voltage but no more than the second threshold voltage, the differential amplifier circuit and the source follower circuit are operated together.

Another input rail-to-rail signal conversion circuit described in Patent Document 1 has a differential amplifier circuit in which a pair of p-type transistors receives an input differential signal, and a source follower circuit in which a pair of n-type transistors receives an input differential signal and supplies a current to a pair of load resistors of the differential amplifier circuit. In this signal conversion circuit, the differential amplifier circuit is operated in a region where an input voltage level is lower than a first threshold voltage, and the source follower amplifier circuit is operated in a region where the input voltage level is higher than a second threshold voltage, whereby the input rail-to-rail is realized complementarily. In a cooperative region where the input voltage level is at least the second threshold voltage but no more than the first threshold voltage, the differential amplifier circuit and the source follower circuit are operated together.

Patent Document 1 WO 2006/126436

DISCLOSURE OF THE INVENTION

Problem to be Solved by the Invention

Incidentally, it is preferred that the high-speed NMOS difference amplifier on the rear stage of the signal conversion circuit described above be operated with a low power-supply voltage, for the reason of reduction of power consumption. In this case, as the signal conversion circuit, it is preferred to use another signal conversion circuit described above, which is capable of outputting without clipping from the threshold value (Vthn) of the NMOS transistor of the high-speed NMOS difference amplifier disposed in the rear stage, to the power-supply voltage level. In other words, it is preferred to use a signal conversion circuit that is provided with a differential amplifier circuit having a p-type transistor and a source follower circuit having an n-type transistor.

In this type of signal conversion circuit, the gain and signal quality need to be improved in the cooperative region because the gain of the differential amplifier circuit starts decreasing.

Therefore, unlike the conventional art, an object of the present invention is to provide a signal conversion circuit capable of increasing the gain in the cooperative region, and a rail-to-rail circuit having this signal conversion circuit.

Means for Solving the Problem

A signal conversion circuit of the present invention is a signal conversion circuit, which takes as input a differential voltage signal to a first input terminal and a second input terminal, converts a common-mode voltage level of the differential voltage signal, and outputs the differential voltage signal having the converted common-mode voltage level from a first output terminal and a second output terminal, the signal conversion circuit having: (a) first and second impedance elements that are connected in series between a low-potential side power supply and the first output terminal; (b) third and fourth impedance elements that are connected in series between the low-potential side power supply and the second output terminal; (c) a first PMOS transistor that has a drain electrode connected to the first output terminal, a gate electrode connected to the second input terminal, and a source electrode; (d) a second PMOS transistor that has a drain electrode connected to the second output terminal, a gate electrode connected to the first input terminal, and a source electrode; (e) a first NMOS transistor that has a source electrode connected between the first and second impedance elements, a gate electrode connected to the first input terminal, and a drain electrode connected to a high-potential side power supply; (f) a second NMOS transistor that has a source electrode connected between the third and fourth impedance elements, a gate electrode connected to the second input terminal, and a drain electrode connected to the high-potential side power supply; and (g) a current source that is provided between the source electrode of the first PMOS transistor and the source electrode of the second PMOS transistor, and the high-potential side power supply, and generates a constant current.

In this signal conversion circuit, the first to fourth impedance elements, the first and second PMOS transistors, and the current source configure a differential amplifier circuit, while the first and second NMOS transistors configure a source follower circuit. The source of the first NMOS transistor of the source follower circuit is connected between the first and second impedance, while the source of the second NMOS transistor of the source follower circuit is connected between the third and fourth impedance elements. For this reason, compared to the conventional art, it is possible to prevent the increase of the voltages of the sources of the first and second NMOS transistors that is caused by drain currents of the PMOS transistors. Therefore, unlike the conventional art, not only the gain of the source follower but also the gain of a cooperative region of the signal conversion circuit can be increased.

Another signal conversion circuit of the present invention is a signal conversion circuit, which takes as input a differential voltage signal to a first input terminal and a second input terminal, converts a common-mode voltage level of the differential voltage signal, and outputs the differential voltage signal having the converted common-mode voltage level from a first output terminal and a second output terminal, the signal conversion circuit having: (a) first and second impedance elements that are connected in series between a low-potential side power supply and the first output terminal; (b) third and fourth impedance elements that are connected in series between the low-potential side power supply and the second output terminal; (c) a first PMOS transistor that has a drain electrode connected to the first output terminal, a gate electrode connected to the second input terminal, and a source electrode connected to a high-potential side power supply; (d) a second PMOS transistor that has a drain electrode connected to the second output terminal, a gate electrode connected to the first input terminal, and a source electrode connected to the high-potential side power supply; (e) a first NMOS transistor that has a source electrode connected between the first and second impedance elements, a gate electrode connected to the first input terminal, and a drain electrode connected to the high-potential side power supply; and (f) a second NMOS transistor that has a source electrode connected between the third and fourth impedance elements, a gate electrode connected to the second input terminal, and a drain electrode connected to the high-potential side power supply.

In this signal conversion circuit, the first to fourth impedance elements and the first and second PMOS transistors configure a pseudo differential amplifier circuit, while the first and second NMOS transistors configure a source follower circuit. The source of the first NMOS transistor of the source follower circuit is connected between the first and second impedance elements, and the source of the second NMOS transistor of the source follower circuit is connected between the third and fourth impedance elements. For this reason, compared to the conventional art, it is possible to prevent the increase of the voltages of the sources of the first and second NMOS transistors that is caused by drain currents of the PMOS transistors. Therefore, unlike the conventional art, not only the gain of the source follower but also the gain of a cooperative region of the signal conversion circuit can be increased.

It is preferred that the signal conversion circuit described above further have a first variable current source that supplies a current to the first and second impedance elements and is capable of changing the size of the current, and a second variable current source that supplies a current to the third and fourth impedance elements and is capable of changing the size of the current.

According to this configuration, the amount of voltage drop of the first and second impedance elements and the amount of voltage drop of the third and fourth impedance elements can be adjusted by adjusting output currents of the first and second variable current sources. Thus, an output common-mode voltage level of the signal conversion circuit can be set appropriate so that a high-speed NMOS difference amplifier disposed on a rear stage can be operated at high gain and high speed.

A rail-to-rail circuit of the present invention has the signal conversion circuit described above and a differential amplifier circuit that is connected to the first output terminal and the second output terminal of the signal conversion circuit, wherein the signal conversion circuit further has a control circuit that monitors at least one of parameters causing fluctuations in an operating point of the differential amplifier circuit, and causes the first variable current source and the second variable current source to change the currents according to the fluctuations caused by the parameters.

Because this rail-to-rail circuit is provided with the signal conversion circuit mentioned above, the output common-mode voltage level of the signal conversion circuit can be made close to a voltage level at which the high-speed NMOS difference amplifier on the rear stage can be operated at high gain and high speed, even when an input common-mode voltage level at which the high-speed NMOS difference amplifier on the rear stage can be operated at high gain and high speed fluctuates due to fluctuations in the power supply voltage or the like. Therefore, the gain can be increased. Moreover, for example, even when threshold voltages of the transistors fluctuate, and the output common-mode voltage level of the signal conversion circuit or the input common-mode voltage level at which the high-speed NMOS difference amplifier on the rear stage can be operated at high gain and high speed fluctuates due to process fluctuation or temperature fluctuation, the output common-mode voltage level can be adjusted appropriately so that the high-speed NMOS difference amplifier on the rear stage can be operated at high gain and high speed.

It is preferred that the first to fourth impedance elements described above be resistors.

Effects of the Invention

Unlike the conventional art, the present invention can increase the gain in the cooperative region of the signal conversion circuit. Thus, compared to the conventional art, the gain in the cooperative region of the rail-to-rail circuit having the signal conversion circuit can be increased more.

Figure 1:
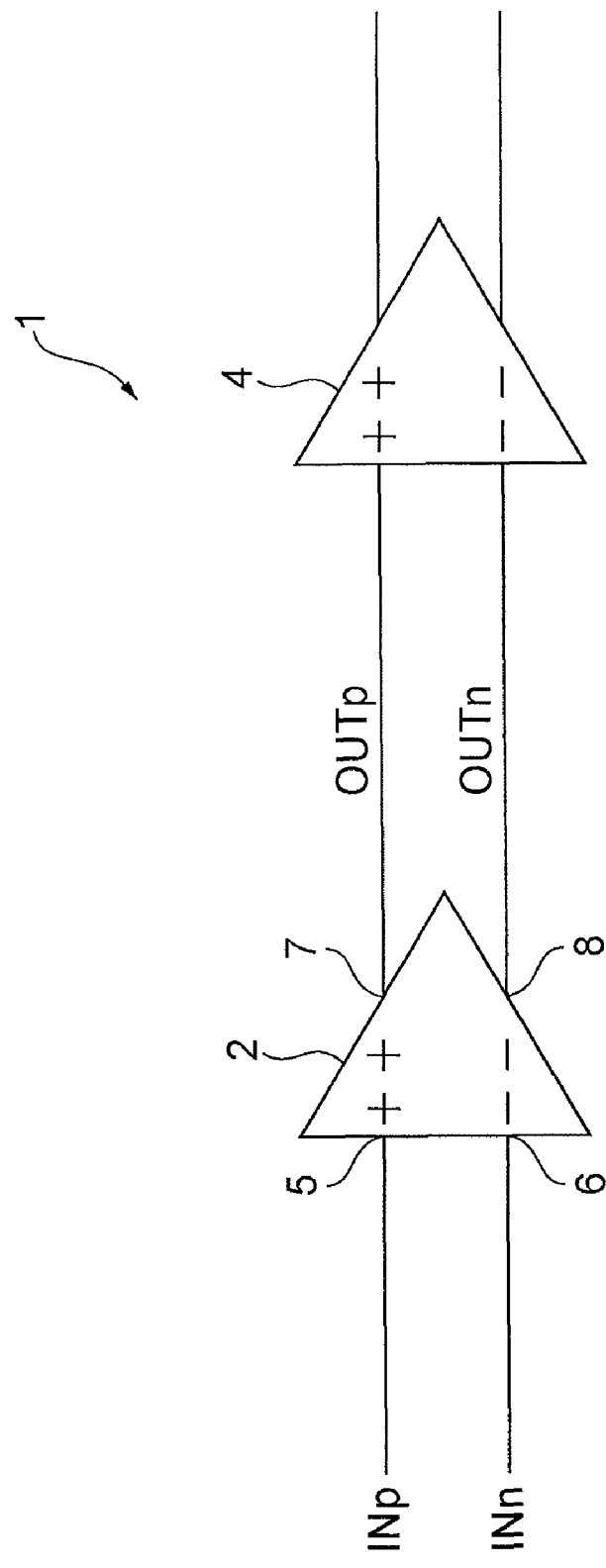
FIG. 1 is a configuration diagram of a rail-to-rail type differential amplifier circuit that has a signal conversion circuit according to a first embodiment of the present invention.

| Explanation of Reference Numerals | |
|---|---|
| 1 | Rail-to-rail circuit |
| 2, 2A, 2B, 2C, 2X | Signal conversion circuits |
| 4 | Differential amplifier circuit |
| 5, 6 | First and second input terminals |
| 7, 8 | First and second output terminals |
| 10 | Difference amplifier |
| 10C | Pseudo difference amplifier |
| 11 to 14 | First to fourth resistors (first to fourth impedance elements) |
| 11X, 13X | Resistors |
| 15, 16 | First and second PMOS transistors |
| 18 | Current source |
| 20 | Source follower |
| 22, 24 | First and second NMOS transistors |
| 31, 32 | First and second variable current sources |
| 41, 41B | Control circuits |
| 51 | Reference voltage generating circuit |
| Vdd | High-potential side power supply |
| Vss | Low-potential side power supply |

BEST MODE FOR CARRYING OUT THE INVENTION

Preferred embodiments of the present invention are now described hereinafter in detail with reference to the drawings. Note that like reference characters are used to indicate the same or like parts in each diagram.

First Embodiment

FIG. 1 is a configuration diagram of a rail-to-rail type differential amplifier circuit that has a signal conversion circuit according to a first embodiment of the present invention. This rail-to-rail circuit 1 is a differential amplifier circuit that acquires an input signal of a wide common-mode voltage range, performs predetermined amplification thereon and outputs the resultant signal, and this differential amplifier circuit is used in, for example, an LVDS receiving apparatus. The rail-to-rail circuit 1 has a signal conversion circuit 2 that converts the common-mode voltage level of an input differential voltage signal into a predetermined common-mode voltage level, and a differential amplifier circuit 4 that amplifies the converted differential voltage signal that is converted into the predetermined common-mode voltage level.

Differential voltage signals INp and INn are input to a first input terminal 5 and second input terminal 6 of the signal conversion circuit 2, respectively. The signal conversion circuit 2 converts the common-mode voltage levels of the differential voltage signals INp and INn into the predetermined common-mode voltage level, and outputs the resultant signals as differential voltage signals OUTp and OUTn from a first output terminal 7 and second output terminal 8. The differential amplifier circuit 4 acquires the differential voltage signals OUTp and OUTn, performs voltage amplification thereon, and outputs the resultant signals.

Figure 2:
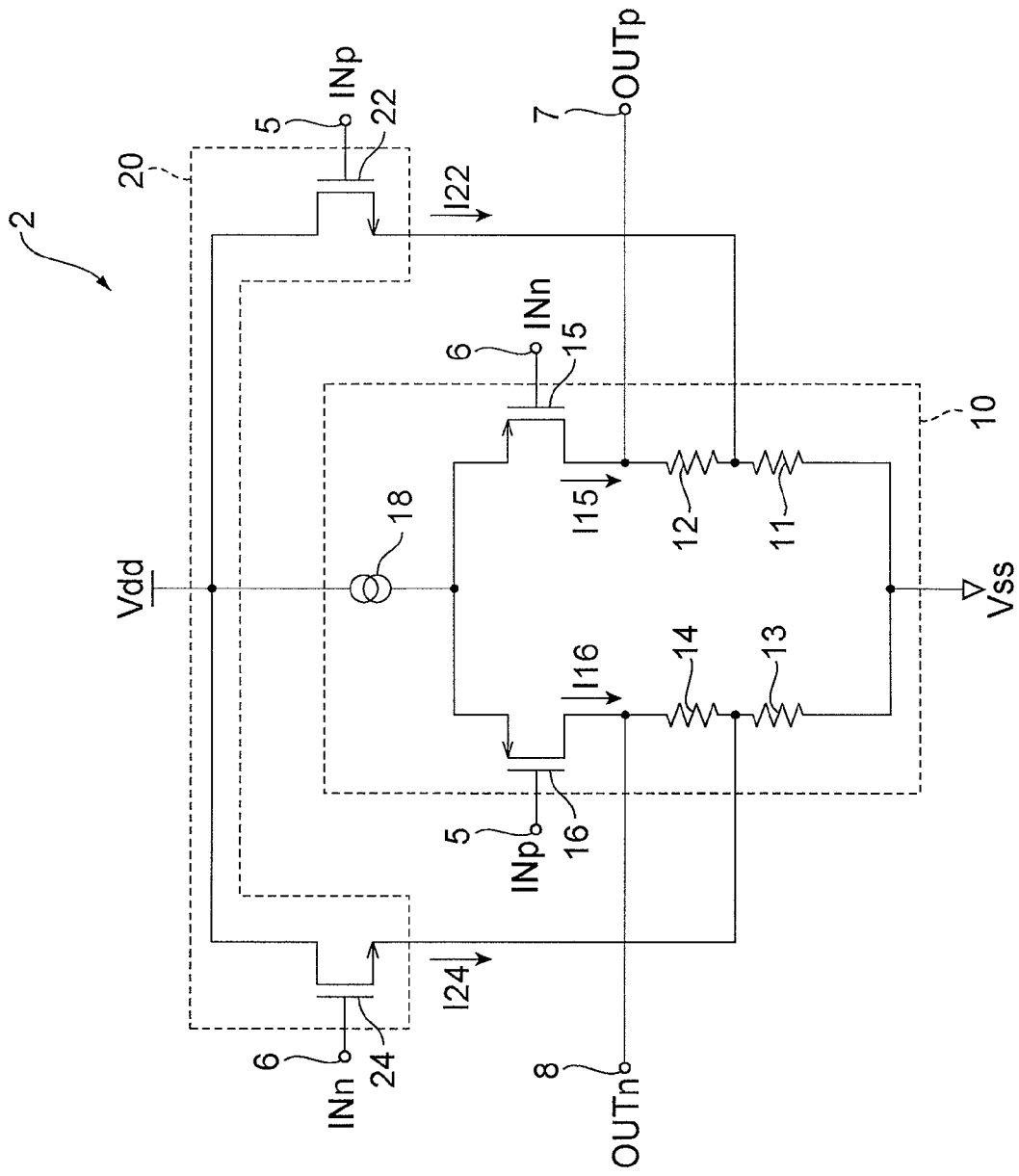
FIG. 2 is a circuit diagram showing the signal conversion circuit according to the first embodiment of the present invention.

FIG. 2 is a circuit diagram showing the signal conversion circuit according to the first embodiment of the present invention. The signal conversion circuit 2 has a difference amplifier 10 performing a differential amplification operation, and a source follower 20 performing a source follower operation.

The difference amplifier 10 is configured by a first PMOS transistor 15 and a second PMOS transistor 16 and further has first to fourth resistors (impedance elements) 11 to 14 and a current source 18. The first and second resistors 11 and 12 are connected in series between a low-potential side power supply Vss and the first output terminal 7, while the third and fourth resistors 13 and 14 are connected in series between the low-potential side power supply Vss and the second output terminal 8. A drain electrode of the first PMOS transistor 15 is connected to the first output terminal 7, a source electrode to the current source 18, and a gate electrode to the second input terminal 6. A drain electrode of the second PMOS transistor 16 is connected to the second output terminal 8, a source electrode to the current source 18, and a gate electrode to the first input terminal 5. The current source 18 is provided between the source electrode of the first PMOS transistor 15 and the source electrode of the second PMOS transistor 16, and a high-potential side power supply Vdd, and generates a constant current Iss.

The source follower 20 has a first NMOS transistor 22 operating as a source follower and a second NMOS transistor 24. More specifically, a source electrode of the first NMOS transistor 22 is connected to a node between the first and second resistors 11 and 12, a gate electrode to the first input terminal 5, and a drain electrode to the high-potential side power supply Vdd. A source electrode of the second NMOS transistor 24 is connected to a node between the third and fourth resistors 13 and 14, a gate electrode to the second input terminal 6, and a drain electrode to the high-potential side power supply Vdd. Note that FIG. 2 shows, separately, the first input terminal 5 connected to the gate electrode of the second PMOS transistor 16 and the first input terminal 5 connected to the gate electrode of the first NMOS transistor 22, but these first input terminals 5 are the same thing. The same applies to the second input terminal 6 connected to the gate electrode of the first PMOS transistor 15 and the second input terminal 6 connected to the gate electrode of the second NMOS transistor 24.

Note that the transistor size of the first PMOS transistor 15 is same as the transistor size of the second PMOS transistor 16, and the transistor size of the first NMOS transistor 22 is also same as the transistor size of the second NMOS transistor 24. Here, the transistor size of each MOS transistor is determined roughly by the gate width/gate length. Furthermore, the resistance value of the first resistor 11 is equal to the resistance value of the third resistor 13, and the resistance value of the second resistor 12 is also equal to the resistance value of the fourth resistor 14.

Operations of the signal conversion circuit 2 are described next. Hereinafter, the resistance values of the first and third resistors 11 and 13 each are expressed as R1, and the resistance values of the second and fourth resistors 12 and 14 each are expressed as R2. Moreover, current values of currents I15, I16 of the first and second PMOS transistors 15, 16 in a differential balanced state each are I1, and current values of currents I22, 24 of the first and second NMOS transistors 22, 24 in a differential balanced state each are expressed as I2. Threshold values of the first PMOS transistor 15 and the second PMOS transistor 16 each are expressed as Vthp, and threshold values of the first NMOS transistor 22 and the second NMOS transistor 24 each are expressed as Vthn. In addition, the level of an input common-mode voltage obtained from the differential voltage signal INp input to the first input terminal 5 and the differential voltage signal INn input to the second input terminal 6 is expressed as Vic, and the level of an output common-mode voltage obtained from the differential voltage signal OUTp output from the first output terminal 7 and the differential voltage signal OUTn output from the second output terminal 8 is expressed as Voc. The signal conversion circuit 2 executes different operations in the following regions: (i) a region where the input common-mode voltage level Vic is at least Vss but no more than Vthn, (ii) a region where the input common-mode voltage level Vic is at least Vdd-Vthp but no more than Vdd, and (iii) a region where the input common-mode voltage level Vic is at least Vthn but no more than Vdd-Vthp. Hereinafter, the operations performed by the signal conversion circuit 2 in these regions are described.

(i) When the input common-mode voltage level Vic is at least Vss but no more than Vthn, the first PMOS transistor 15 and the second PMOS transistor 16 of the difference amplifier 10 are operated, but the source follower 20 is not operated. In this case, the output common-mode voltage level Voc can be expressed by the following equation (1).

[Equation 1]

$$Voc = (R1+R2) \cdot I1 \qquad (1)$$

Here, the voltage value of the low-potential side power supply Vss is considered 0 V. The differential voltage signals OUTp and OUTn of the common-mode voltage of the level described above are output from the first output terminal 7 and the second output terminal 8 respectively.

(ii) When the input common-mode voltage level Vic is at least Vdd-Vthp but no more than Vdd, the first NMOS transistor 22 and the second NMOS transistor 24 of the source follower 20 are operated, but the difference amplifier 10 is not operated. In this case, because the first NMOS transistor 22 and the second NMOS transistor 24 configure a source follower circuit, the output common-mode voltage level Voc can be expressed by the following equation (2)

[Equation 2]

$$Voc = R1 \cdot R2 \qquad (2)$$

(iii) When the input common-mode voltage level Vic is at least Vthn but no more than Vdd-Vthp, the difference amplifier 10 and the source follower 20 are operated together. The output common-mode voltage level Voc is determined by the following equation (3).

[Equation 3]

$$Voc = (R1+R2) \cdot I1 + R1 \cdot I2 \qquad (3)$$

Note that in the signal conversion circuit 2, the sizes or values of the current source 18, the first to fourth resistors 11 to 14, the first PMOS transistor 15, the second PMOS transistor 16, the first NMOS transistor 22, and the second NMOS transistor 24 satisfy the equations (1) to (3) mentioned above, and are adjusted such that the output common-mode voltage level Voc falls in an operation region of the differential amplifier circuit 4.

Figure 3:
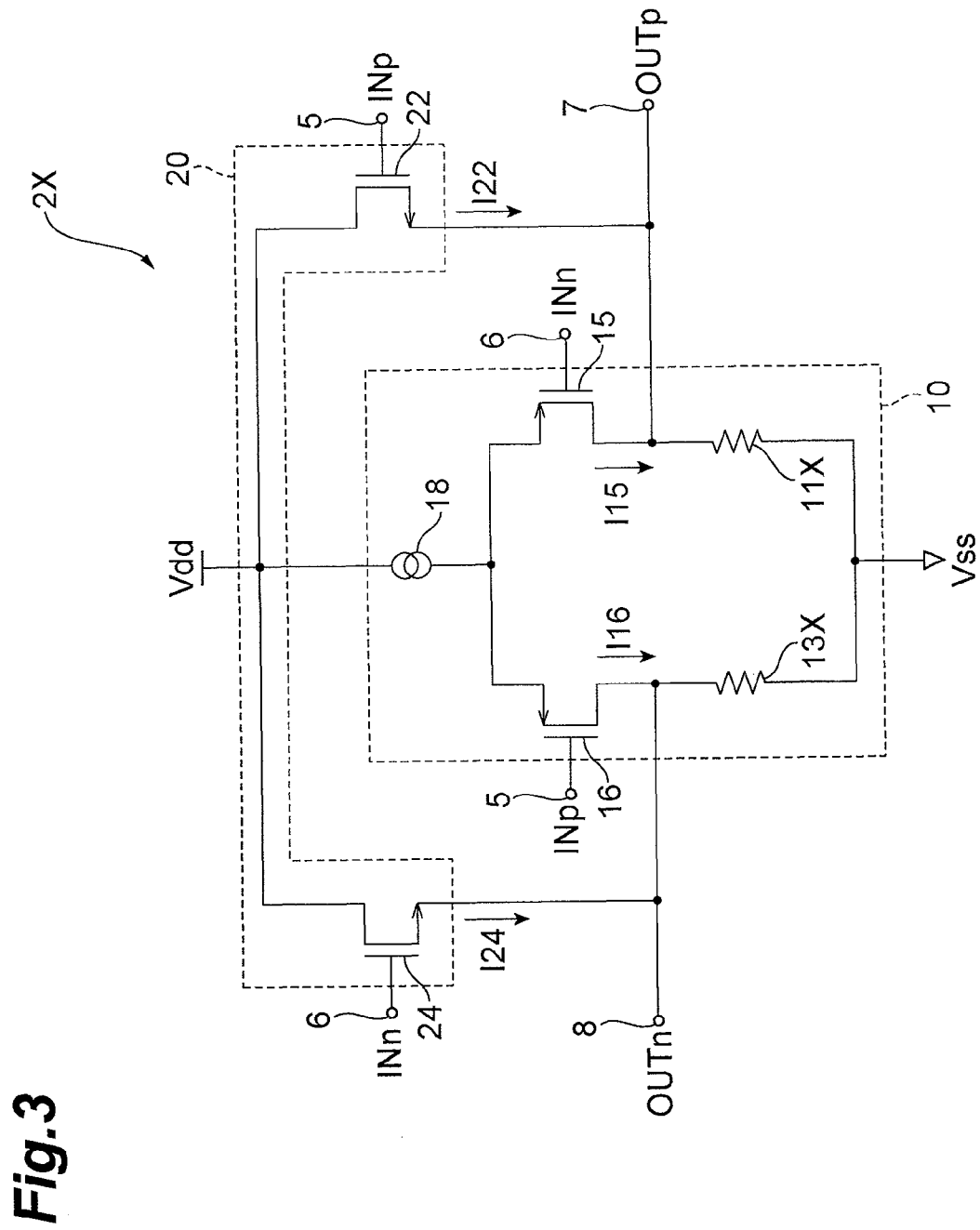
FIG. 3 is a circuit diagram showing a signal conversion circuit of a comparison example.

Next, the advantages of the signal conversion circuit 2 of the first embodiment are described while comparing the signal conversion circuit 2 of the first embodiment with a signal conversion circuit of a comparison example. FIG. 3 is a circuit diagram showing a signal conversion circuit 2X of the comparison example. The signal conversion circuit 2X of the comparison example shown in FIG. 3 is different from the signal conversion circuit 2 of the first embodiment in having a resistor 11X in place of the first and second resistors 11, 12, and a resistor 13X in place of the third and fourth resistors 13, 14. The signal conversion circuit 2X of the comparison example is further different from the signal conversion circuit 2 of the first embodiment in that the sources of the transistors 22, 24 of the source follower 20 are connected to the output terminals 7, 8 respectively. The rest of the configuration of the signal conversion circuit 2X of the comparison example is same as that of the signal conversion circuit 2.

Figure 4:
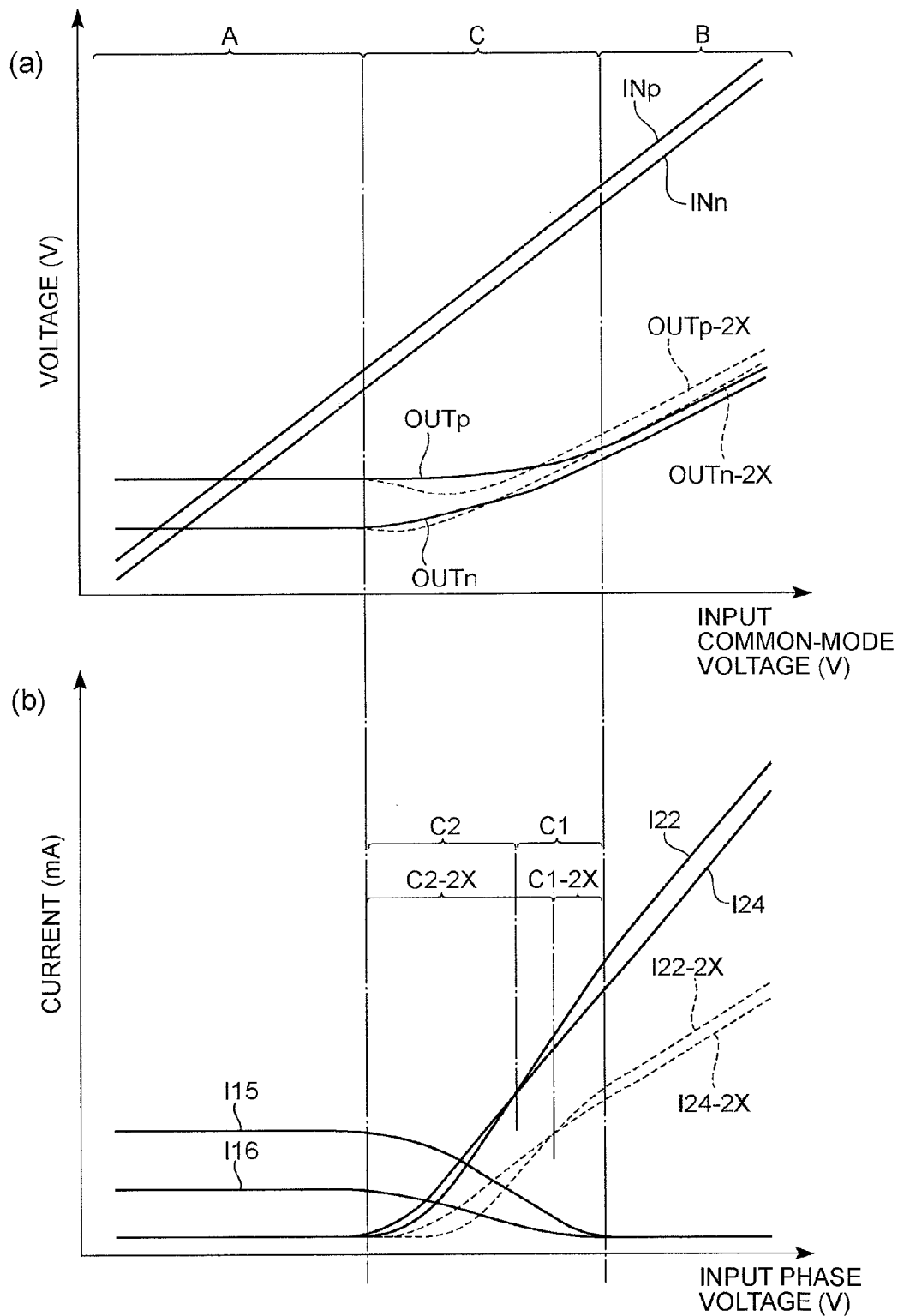
FIG. 4 is a diagram showing a result of simulation of a voltage of each section and current of each section with respect to an input common-mode voltage.

Simulation results of the signal conversion circuit 2X of the comparison example and of the signal conversion circuit 2 of the first embodiment are shown. FIG. 4 is a diagram showing a result of simulation of a voltage of each section and current of each section with respect to the input common-mode voltage. The voltage of each section is shown in (a) of FIG. 4, and the current of each section is shown in (b) of FIG. 4.

In (a) of FIG. 4, curves INp, INn represent input voltages INp, INn of the signal conversion circuits 2 and 2X, respectively. For example, a voltage difference between the input voltages INp and INn is 100 mV. Curves OUTp-2X, OUTn-2X represent output voltages OUTp, OUTn of the signal conversion circuit 2X of the comparison example, respectively. Curves OUTp, OUTn represent the output voltages OUTp, OUTn of the signal conversion circuit 2 of the first embodiment, respectively.

In (b) of FIG. 4, curves I22-2X, I24-2X represent, respectively, the current I22 flowing to the first NMOS transistor 22 of the source follower 20 in the signal conversion circuit 2X of the comparison example, and the current I24 flowing to the second NMOS transistor 24 of the same. Curves I22, I24 represent, respectively, the current I22 flowing to the first NMOS transistor 22 of the source follower 20 in the signal conversion circuit 2 of the first embodiment, and the current I24 flowing to the second NMOS transistor 24 of the same. Curves I15, I16 represent, respectively, the current I15 flowing to the first PMOS transistor 15 of the difference amplifier 10 in the signal conversion circuits 2, 2X, and the current I16 flowing to the second PMOS transistor 16 of the same.

In addition, in (a) and (b) of FIG. 4, a region A is (i) the region where the difference amplifier 10 is operated but the source follower 20 is not operated, and a region B is (ii) the region where the source follower 20 is operated but the difference amplifier 10 is not operated. A region C is (iii) the cooperative region where the difference amplifier 10 and the source follower 20 are operated together.

Suppose that only the difference amplifier 10 is operated independently. In this simulation condition that the voltage difference between the input voltages INp, INn is +50 mV and −50 mV in relation to the differential balanced state, the current I15 becomes greater than the current I16. On the other hand, suppose that only the source follower 20 is operated independently. In this simulation condition that the voltage difference between the input voltages INp, INn is +50 mV and −50 mV in relation to the differential balanced state, the current I22 becomes greater than the current I24.

As shown by the curves I22-2X, I24-2X, in the signal conversion circuit 2X of the comparison example, it is understood that the magnitude relation between the currents is as described above in a high input common-mode voltage side region C1-2X of the cooperative region C. In this region C1-2X, a positive gain generated from an output current from the source follower 20 is added to the gain of the difference amplifier 10 (effective region).

However, in a low input common-mode voltage side region C2-2X of the cooperative region C, it is understood that the current I22 becomes smaller than the current I24 in the source follower 20. In this region C2-2X, a negative gain generated from the output current from the source follower 20 is added to the gain of the difference amplifier 10 (ineffective region).

The following reasons can be considered as an explanation of these facts. When the input voltages INp, INn are changed by +50 mV, −50 mV from the differential balanced state, the amount of voltage drop of the resistor 11X increases as the current I15 of the difference amplifier 10 increases. As a result, the voltage OUTp of the output terminal 7, i.e., a source voltage of the first NMOS transistor 22 of the source follower 20, rises, whereby the current I22 decreases. Furthermore, the amount of voltage drop of the resistor 13X decreases as the current I16 of the difference amplifier 10 decreases. As a result, the voltage OUTn of the output terminal 8, i.e., a source voltage of the second NMOS transistor 24 of the source follower 20, decreases, whereby the current I24 increases. Consequently, in the ineffective region C2-2X of the cooperative region C, an output differential voltage (the difference between the voltage OUTp-2X and the voltage OUTn-2X) becomes low, as shown by the curves OUTp-2X, OUTn-2X.

However, as shown by the curves I22, I24, although the current I22 and the current I24 are inverted in the ineffective region C2 of the cooperative region C in the signal conversion circuit 2 of the first embodiment, it is understood that the upper limit of an input common-mode voltage range where such inversion occurs becomes low, whereby the ineffective region C2 is narrowed down. Moreover, it is understood that an inversion difference current between the currents I22, I24 is low in the ineffective region C2. As a result, the gain of the signal conversion circuit 2 increases in the cooperative region C, and the output differential voltage (the difference between the voltage OUTp and the voltage OUTn) increases, as shown by the curves OUTp, OUTn.

As described above, according to the signal conversion circuit 2 of the first embodiment, the increase of the source voltages of the first and second NMOS transistors 22, 24 of the source follower 20 that is caused by the output current of the difference amplifier 10 can be inhibited better than in the conventional art, whereby the gain of the signal conversion circuit 2 in the cooperative region C can be increased.

Furthermore, in the signal conversion circuit 2 of the first embodiment, when the input common-mode voltage level Vic fluctuates at the borderline between the region where only the difference amplifier 10 is operated and the region where the difference amplifier 10 and the source follower 20 are operated together, that is, in the vicinity of Vthn, the operation of either the difference amplifier 10 or the source follower 20 weakens, while the other grows. Also when the input common-mode voltage level Vic fluctuates at the borderline between the region where only the source follower 20 is operated and the region where the difference amplifier 10 and the source follower 20 are operated together, that is, in the vicinity of Vdd-Vthp, the operation of either the difference amplifier 10 or the source follower 20 weakens, while the other grows. Therefore, smooth and continuous output common-mode voltage level Voc in relation to the changes of the input common-mode voltage level Vic from Vss to Vdd can be obtained.

Compared to a circuit configured by two difference amplifier circuits, the difference amplifier 10 and the source follower 20 configuring the signal conversion circuit 2 of the first embodiment are capable of reducing the circuit area and the consumption current due to the small number of elements. In addition, the first and second NMOS transistors 22, 24 of the source follower 20 have a lower load capacity than an inverting amplifier circuit and are capable of being operated at high speed, because the differential voltage signals INp and INn are amplified in the normal rotation. Because the operation speed of the source follower is not dependent upon the size of the first and second NMOS transistors 22, 24, the size of the first and second NMOS transistors 22, 24 can be reduced while keeping the high speed characteristics of the circuit. As a result, the input capacitance can be reduced, and the signal conversion circuit 2 that is operated at high speed can be realized.

Furthermore, according to the signal conversion circuit 2 of the first embodiment, the gain can be increased without increasing the resistance values of the first to fourth resistors 11 to 14. By increasing the current, i.e., the transistor size (gate width/gate length), the gain can be increased without increasing the mutual conductance of the transistors of the difference amplifier 10 (first and second PMOS transistors 15, 16) and the transistors of the source follower 20 (first and second NMOS transistors 22, 24). Therefore, according to the signal conversion circuit 2 of this first embodiment, the gain can be increased without reducing the high speed properties nor significantly increasing the circuit area and power consumption.

Hence, according to the rail-to-rail circuit 1 with the signal conversion circuit 2 of the first embodiment, the gain in the cooperative region C can be increased without reducing the high speed properties nor significantly increasing the circuit area and power consumption. Therefore, the signal quality can be improved.

Second Embodiment

Figure 5:
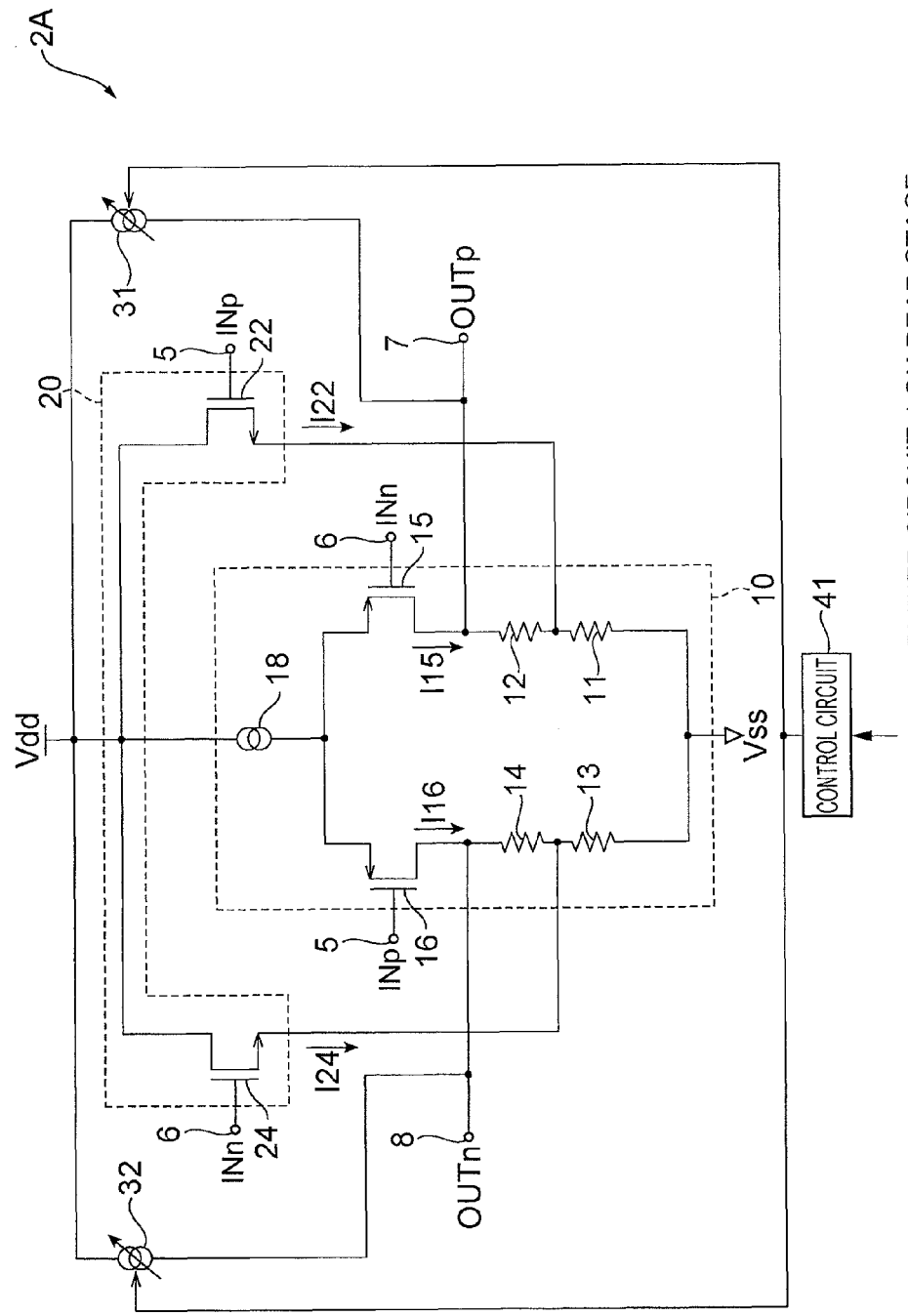
FIG. 5 is a circuit diagram showing a signal conversion circuit according to a second embodiment of the present invention.

FIG. 5 is a circuit diagram showing a signal conversion circuit according to a second embodiment of the present invention. As shown in FIG. 5, a signal conversion circuit 2A is different from the signal conversion circuit 2 of the first embodiment in further having first and second variable current sources 31, 32 and a control circuit 41. The rest of the configuration of the signal conversion circuit 2A is same as that of the signal conversion circuit 2.

The first variable current source 31 is connected between the first output terminal 7 and the high-potential side power supply Vdd and supplies currents to the first and second resistors 11, 12. The first variable current source 31 can change the current values of the supplied currents according to a control signal sent from the control circuit 41.

Similarly, the second variable current source 32 is connected between the second output terminal 8 and the high-potential side power supply Vdd and supplies currents to the third and fourth resistors 13, 14. The second variable current source 32 can change the current values of the supplied currents according to the control signal sent from the control circuit 41.

The control circuit 41 monitors power-supply voltage of the differential amplifier circuit 4 on the rear stage and generates a control signal such as to change output currents of the first and second variable current sources 31, 32 according to the fluctuations in the power-supply voltage.

Specifically, when the power-supply voltage of the differential amplifier circuit 4 on the rear stage is increased, the control circuit 41 controls the first and second variable current sources 31, 32 so that the output currents of the first and second variable current sources 31, 32 increase. When, on the other hand, the power-supply voltage of the differential amplifier circuit 4 on the rear stage is reduced, the control circuit 41 controls the first and second variable current sources 31, 32 so that the output currents of the first and second variable current sources 31, 32 decrease.

Here, it is preferred that an operating point of the differential amplifier circuit 4 be a midpoint of the input common-mode voltage range at which a high-speed operation is possible. However, the power-supply voltage is a parameter for causing changes in the operating point of the differential amplifier circuit 4, thus the increase of the power-supply voltage increases an effective input common-mode voltage level that is an input common-mode voltage level range at which the differential amplifier circuit 4 on the rear stage can be operated at high gain and high speed, and the decrease of the power-supply voltage reduces the effective input common-mode voltage level range of the differential amplifier circuit 4 on the rear stage.

According to the signal conversion circuit 2A of the second embodiment, by increasing the output currents of the first and second variable current sources 31, 32 when the power-supply voltage of the differential amplifier circuit 4 on the rear stage increases, the amount of voltage drop of each of the first and second resistors 11, 12 and the amount of voltage drop of each of the third and fourth resistors 13, 14 are increased, whereby the output common-mode voltage level can be increased. On the other hand, by reducing the output currents of the first and second variable current sources 31, 32 when the power-supply voltage of the differential amplifier circuit 4 on the rear stage decreases, the amount of voltage drop of each of the first and second resistors 11, 12 and the amount of voltage drop of each of the third and fourth resistors 13, 14 are reduced, whereby the output common-mode voltage level can be reduced. Therefore, according to the signal conversion circuit 2A of the second embodiment, even when the effective input common-mode voltage level of the differential amplifier circuit 4 on the rear stage fluctuates due to the fluctuations in the power-supply voltage, the output common-mode voltage level can be adjusted appropriately.

Hence, according to the rail-to-rail circuit 1 with the signal conversion circuit 2A of the second embodiment, because the output common-mode voltage level of the signal conversion circuit 2A can be appropriately adjusted even when the effective input common-mode voltage level range of the differential amplifier circuit 4 on the rear stage fluctuates due to the fluctuations in the power-supply voltage, the gain and the signal quality can be prevented from decreasing.

Third Embodiment

Figure 6:
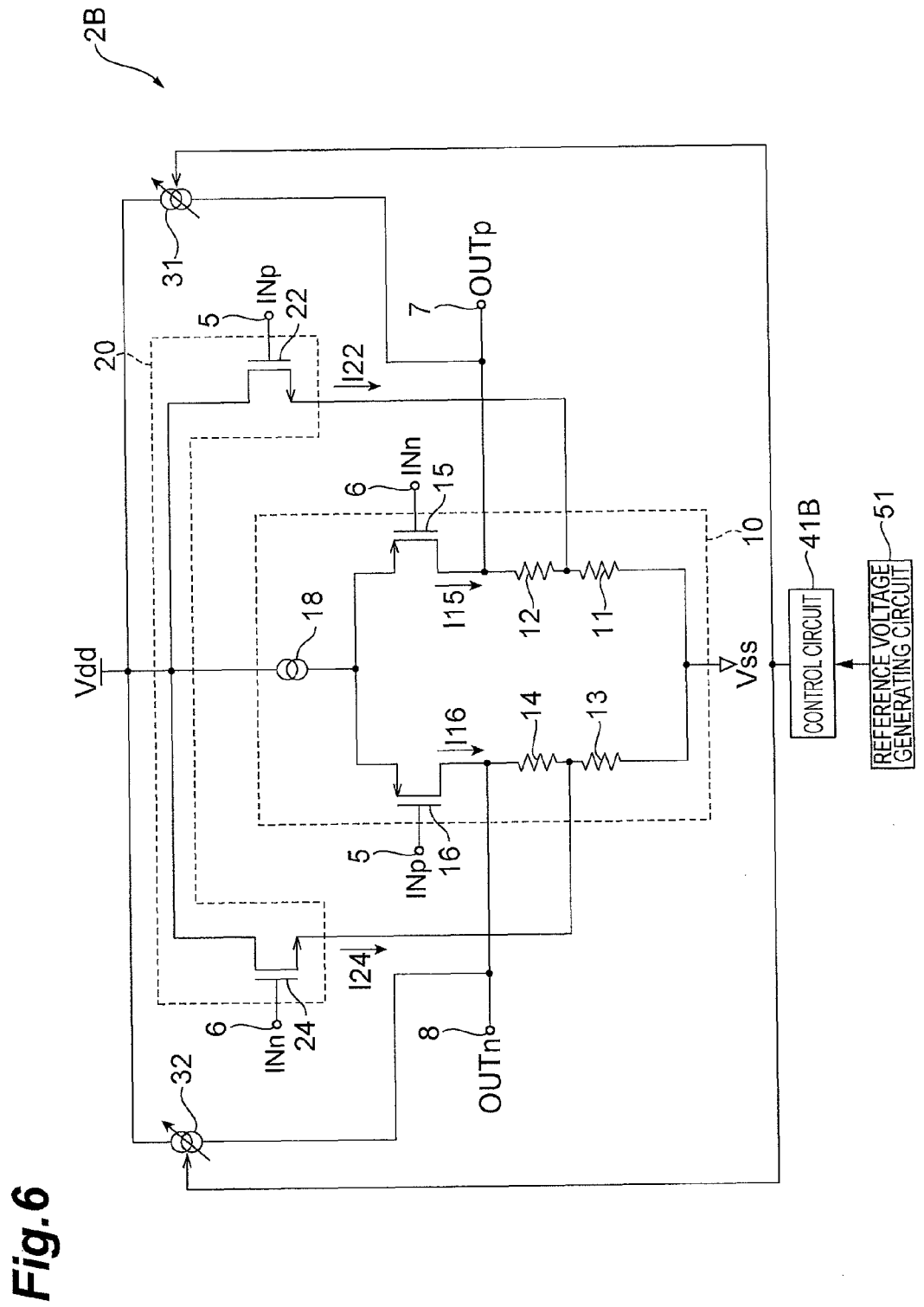
FIG. 6 is a circuit diagram showing a signal conversion circuit according to a third embodiment of the present invention.

FIG. 6 is a circuit diagram showing a signal conversion circuit according to a third embodiment of the present invention. As shown in FIG. 6, a signal conversion circuit 2B is different from the signal conversion circuit 2A of the second embodiment in having a control circuit 41B in place of the control circuit 41. The signal conversion circuit 2B also has a reference voltage generating circuit 51. The rest of the configuration of the signal conversion circuit 2B is same as that of the signal conversion circuit 2A.

The reference voltage generating circuit 51 is formed within the same chip as the difference amplifier 10 and the source follower 20, and generates a reference voltage that fluctuates depending on process fluctuation or temperature fluctuation of the chip.

The control circuit 41B receives the reference voltage from the reference voltage generating circuit 51, and generates a control signal such as to change output currents of the first and second variable current sources 31, 32 according to fluctuations of this reference voltage.

Here, the process fluctuation or temperature fluctuation is a parameter causing fluctuations in the operating point of the signal conversion circuit 2B and the operating point of the differential amplifier circuit 4. When the process fluctuation or temperature fluctuation occurs, for example, the operating points fluctuate in accordance with fluctuation of the resistance values of resistor elements or fluctuation of the threshold voltages of the transistors or ON resistance values. Also, the output common-mode voltage level or an operating point of the high-speed NMOS difference amplifier on the rear stage fluctuates. As a result, the gain of the rail-to-rail differential amplifier circuit having the signal conversion circuit also fluctuates.

The control circuit 41B controls the output currents of the first and second variable current sources 31, 32 so as to prevent the output common-mode voltage level or the input common-mode voltage level from fluctuating according to the fluctuation of the reference voltage from the reference voltage generating circuit 51.

According to the signal conversion circuit 2B of the third embodiment, even when the output common-mode voltage level fluctuates due to the process fluctuation or temperature fluctuation, the output common-mode voltage level can be adjusted to the range where the high-speed NMOS difference amplifier on the rear stage can be operated at high gain and high speed. Therefore, the gain of the signal conversion circuit 2B can be adjusted appropriately.

Therefore, according to the rail-to-rail circuit 1 with the signal conversion circuit 2B of the third embodiment, even when the output common-mode voltage level of the signal conversion circuit 2B fluctuates due to the process fluctuation or temperature fluctuation, the output common-mode voltage of the signal conversion circuit 2B can be adjusted appropriately. Hence, the gain of the rail-to-rail type differential amplifier circuit having the signal conversion circuit can be appropriately adjusted and the signal quality can be improved.

Figure 7:
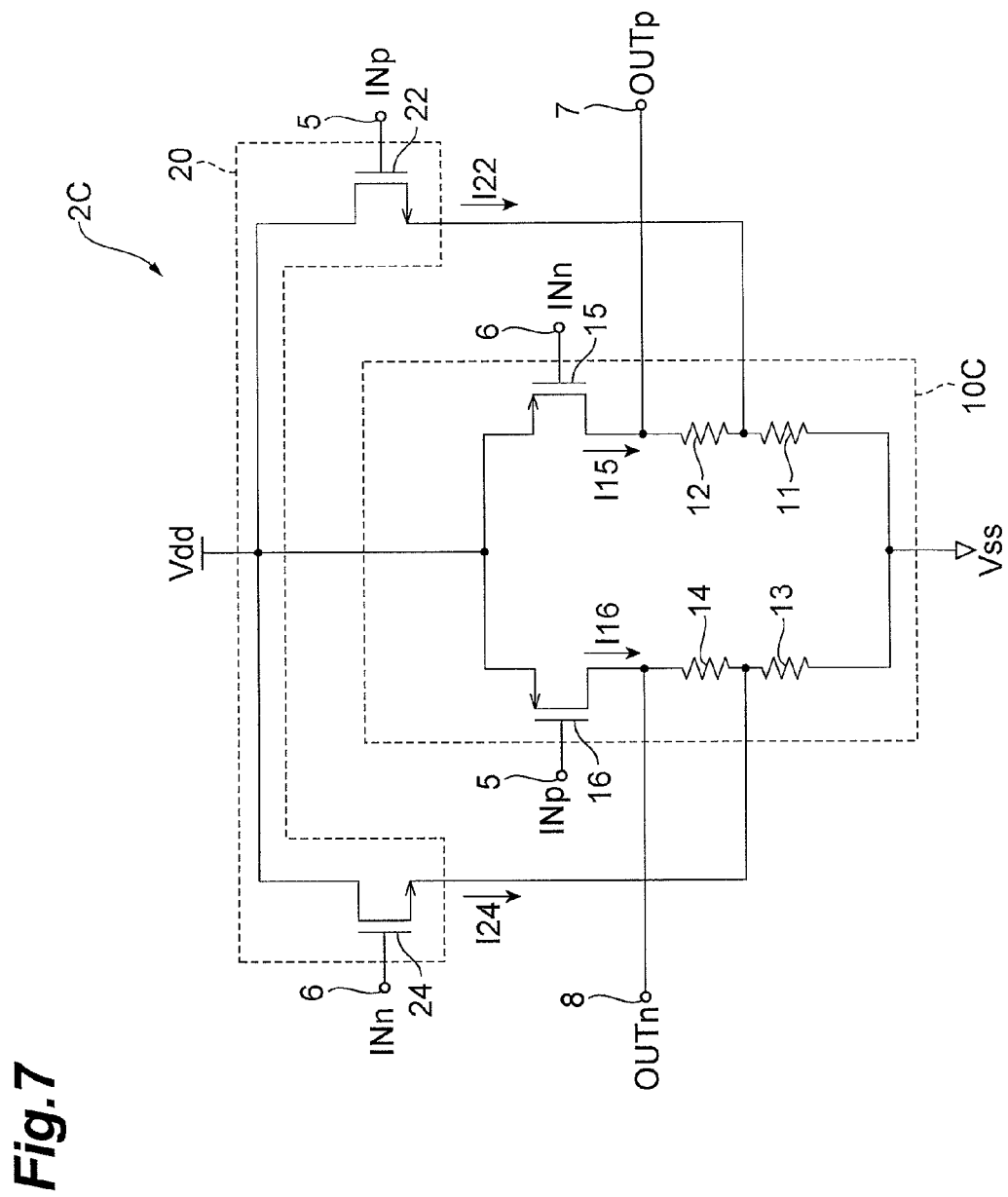
FIG. 7 is a circuit diagram showing a signal conversion circuit according to a modification of the present invention.

Note that the present invention is not limited to the embodiments described above and can be modified in various ways. For example, the difference amplifier 10 of the embodiments may not have the current source 18. As shown in FIG. 7, a signal conversion circuit 2C of a modification may have, in place of the difference amplifier 10, a pseudo difference amplifier 10C in which the sources of the first and second PMOS transistors 15, 16 are connected to the high-potential side power supply Vdd. In this configuration as well, the same advantages can be achieved.

Furthermore, although the embodiments have illustrated a resistor as the load of the difference amplifier 10, various elements can be applied to the load of the difference amplifier 10 as long as the elements each have a resistance value or an impedance at a target frequency. For example, a transistor can be considered as this type of element, which can form a load such as an active load.

Figure 8:
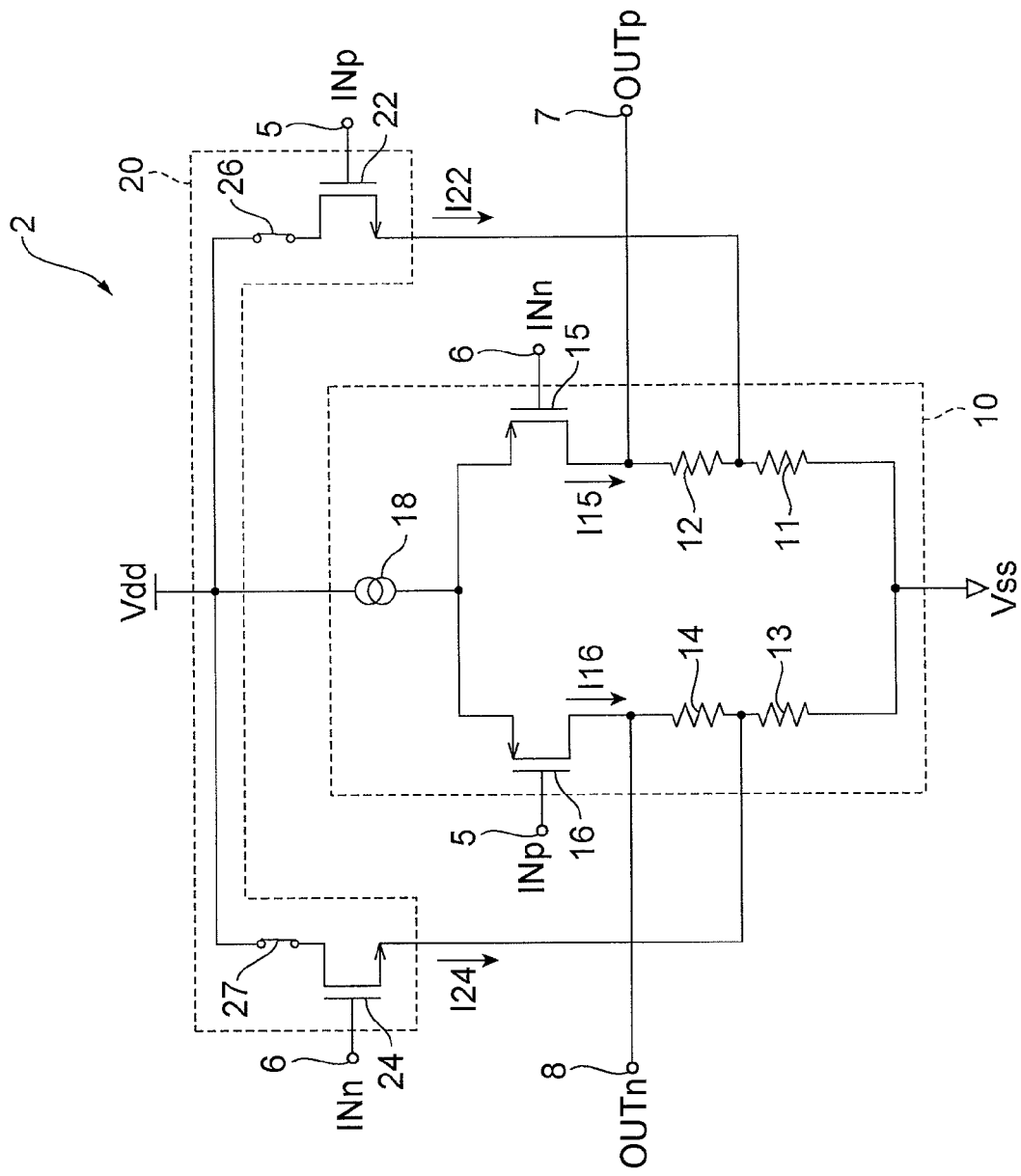
FIG. 8 is a circuit diagram showing the signal conversion circuit according to the modification of the present invention.

Moreover, the first embodiment has illustrated the circuit in which the drain electrode of the first NMOS transistor 22 is directly connected to the high-potential side power supply Vdd, and the drain electrode of the second NMOS transistor 24 directly to the high-potential side power supply Vdd. However, as shown in FIG. 8, switches 26, 27 for switching on/off the supply of current from the high-potential side power supply Vdd to the first NMOS transistor 22 and the second NMOS transistor 24 may be interposed between the high-potential side power supply Vdd and the pair of drain electrodes of the first and second NMOS transistor 22, 24. These switches 26, 27 are turned on/off by an on/off signal from the outside.

For example, when the switches 26, 27 are turned off to stop the supply of current from the high potential power supply Vdd to the first NMOS transistor 22 and the second NMOS transistor 24, the impact of the operations of the signal conversion circuit 2 of the first embodiment on the other circuit blocks can be eliminated, and the operations of the other circuit blocks that are integrated on the same substrate as the signal conversion circuit 2 can be checked.

More specifically, when the signal conversion circuit 2 receives an output voltage from the differential amplifier circuit that uses the NMOS transistors, i.e., the differential amplifier circuit that has the load resistances connected to the high-potential side power supply Vdd, the output voltage of the differential amplifier circuit becomes equivalent to the high-potential side power supply Vdd when there is no data signal and the NMOS transistors are off. At this moment, although the first and second PMOS transistors 15, 16 of the difference amplifier 10 of the signal conversion circuit 2 are turned off, the first and second NMOS transistors 22, 24 of the source follower 20 are turned on.

Therefore, an excessive amount of current is prevented from flowing to the source follower 20, by turning the switches 26, 27 off. As a result, for example, whether the other circuit blocks are operated abnormally or not can be checked simply by monitoring the current of the power supply.

Moreover, in the second embodiment, although the control circuit 41 generates the control signal in accordance with the power-supply voltage of the differential amplifier circuit 4 on the rear stage, the control signal may be generated in accordance with the power-supply voltage of the signal conversion circuit 2A itself. For example, when the power-supply voltage of the signal conversion circuit 2A rises, the output common-mode voltage level of the signal conversion circuit 2A increases. This means that, in the differential amplifier circuit 4 on the rear stage, the effective input common-mode voltage level range, which is the input common-mode voltage level range at which it can be operated at high gain and high speed, decreases. In this case, the control circuit 41 monitors the power-supply voltage of the signal conversion circuit 2A and adjusts the output common-mode voltage level of the signal conversion circuit 2A so that it decreases. Accordingly, the output common-mode voltage level of the signal conversion circuit 2A can be adjusted appropriately with respect to the operating point of the differential amplifier circuit 4 on the rear stage.

In addition, the second embodiment has described an example where the control circuit 41 generates the control signal in accordance with the power-supply voltage of the differential amplifier circuit 4 on the rear stage, and the third embodiment a case where the control circuit 41B generates the control signal in accordance with the reference voltage of the reference voltage generating circuit 51. However, the control circuits 41, 41B may generate a control current in accordance with the parameters that cause fluctuations in the effective common-mode input voltage range of the differential amplifier circuit 4 on the rear stage, regardless of the power-supply voltage or the reference voltage of the reference voltage generating circuit formed within the same chip, as long as the parameters are used. For example, the output common-mode voltage level can be adjusted to the common-mode input voltage range at which the high-speed NMOS difference amplifier on the rear stage can be operated at high gain and high speed, by allowing the control circuits 41, 41B to acquire a voltage or current dependent on the power-supply voltage of the differential amplifier circuit 4 on the rear stage and then to generate the control current in accordance with the current or voltage.

INDUSTRIAL APPLICABILITY

Unlike the conventional art, the present invention can be used for the purpose of increasing the gain of the signal conversion circuit in the cooperative region. Therefore, the present invention can be used for the purpose of increasing the gain of the rail-to-rail circuit having the signal conversion circuit in the cooperative region more than in the conventional art.

The invention claimed is:

1. A signal conversion circuit, which takes as input a differential voltage signal to a first input terminal and a second input terminal, converts a common-mode voltage level of the differential voltage signal, and outputs the differential voltage signal having the converted common-mode voltage level from a first output terminal and a second output terminal, the signal conversion circuit comprising:
    first and second impedance elements that are connected in series between a low-potential side power supply and the first output terminal;
    third and fourth impedance elements that are connected in series between the low-potential side power supply and the second output terminal;
    a first PMOS transistor that has a drain electrode connected to the first output terminal, a gate electrode connected to the second input terminal, and a source electrode;
    a second PMOS transistor that has a drain electrode connected to the second output terminal, a gate electrode connected to the first input terminal, and a source electrode;
    a first NMOS transistor that has a source electrode connected between the first and second impedance elements, a gate electrode connected to the first input terminal, and a drain electrode connected to a high-potential side power supply;
    a second NMOS transistor that has a source electrode connected between the third and fourth impedance elements, a gate electrode connected to the second input terminal, and a drain electrode connected to the high-potential side power supply; and
    a current source that is connected between the source electrode of the first PMOS transistor and the source electrode of the second PMOS transistor, and the high-potential side power supply and generates a constant current.

2. A signal conversion circuit, which takes as input a differential voltage signal to a first input terminal and a second input terminal, converts a common-mode voltage level of the differential voltage signal, and outputs the differential voltage signal having the converted common-mode voltage level from a first output terminal and a second output terminal, the signal conversion circuit comprising:
    first and second impedance elements that are connected in series between a low-potential side power supply and the first output terminal;
    third and fourth impedance elements that are connected in series between the low-potential side power supply and the second output terminal;
    a first PMOS transistor that has a drain electrode connected to the first output terminal, a gate electrode connected to the second input terminal, and a source electrode connected to a high-potential side power supply;
    a second PMOS transistor that has a drain electrode connected to the second output terminal, a gate electrode connected to the first input terminal, and a source electrode connected to the high-potential side power supply;
    a first NMOS transistor that has a source electrode connected between the first and second impedance elements, a gate electrode connected to the first input terminal, and a drain electrode connected to the high-potential side power supply; and a second NMOS transistor that has a source electrode connected between the third and fourth impedance elements, a gate electrode connected to the second input terminal, and a drain electrode connected to the high-potential side power supply.

3. The signal conversion circuit according to claim 1 or 2, further comprising:
   a first variable current source that supplies a current to the first and second impedance elements and is capable of changing the size of the current; and
   a second variable current source that supplies a current to the third and fourth impedance elements and is capable of changing the size of the current.

4. The signal conversion circuit according to any of claims 1 to 3, wherein the first to fourth impedance elements are resistors.

5. A rail-to-rail circuit, comprising:
   the signal conversion circuit described in claim 3; and
   a differential amplifier circuit that is connected to a first output terminal and second output terminal of the signal conversion circuit,
   wherein the signal conversion circuit further has a control circuit that monitors at least one of parameters causing fluctuations in an operating point of the differential amplifier circuit, and causes a first variable current source and second variable current source to change currents according to the fluctuations caused by the parameters.

* * * * *